United States Patent
Hagerman, III

(10) Patent No.: US 6,708,834 B2
(45) Date of Patent: Mar. 23, 2004

(54) HOUSING FOR INTRINSICALLY-SAFE ELECTRONICS

(75) Inventor: Edwin Arthur Hagerman, III, Broomfield, CO (US)

(73) Assignee: Micro Motion, Inc., Boulder, CO (US)

( * ) Notice: Subject to any disclaimer, the term of this patent is extended or adjusted under 35 U.S.C. 154(b) by 282 days.

(21) Appl. No.: 09/884,773

(22) Filed: Jun. 19, 2001

(65) Prior Publication Data

US 2001/0030189 A1 Oct. 18, 2001

Related U.S. Application Data

(63) Continuation-in-part of application No. 09/540,858, filed on Mar. 31, 2000.

(51) Int. Cl.[7] ................................................. B65D 6/28
(52) U.S. Cl. .................... 220/4.02; 206/305; 73/204.22
(58) Field of Search ................................ 220/295, 297, 220/300, 293, DIG. 32, 4.02; 215/332, 342, 222; 206/305, 701; 361/679; 73/204.22, 861, 861.18, 861.19

(56) References Cited

U.S. PATENT DOCUMENTS

| | | |
|---|---|---|
| 1,456,333 A | 5/1923 | Nelson |
| 3,312,336 A | 4/1967 | Fally |
| 3,831,802 A | 8/1974 | Chambers |
| 4,473,170 A | 9/1984 | Ciancimino |
| 5,072,850 A | 12/1991 | Gagnon et al. |
| 5,529,201 A | 6/1996 | Tallent et al. |
| 5,530,357 A | 6/1996 | Cosman et al. ............. 324/326 |
| 5,680,954 A | 10/1997 | Arnold et al. |
| 5,762,437 A | 6/1998 | Neilson et al. ............. 403/324 |
| 5,947,318 A | 9/1999 | Palm |
| 5,952,559 A | 9/1999 | Harris et al. ................. 73/49.7 |
| 6,048,229 A | 4/2000 | Lazaro, Jr. .................. 439/681 |

*Primary Examiner*—Mickey Yu
*Assistant Examiner*—Troy Arnold
(74) *Attorney, Agent, or Firm*—Duft Setter Ollila & Bornsen LLC

(57) ABSTRACT

A housing comprised of a first member, a second member, a seal, and electronics. The first member has a body comprised of a first end portion and a second end portion. The first end portion of the first member comprises at least one pin protruding from the first end portion of the first member. The second member has a body and a cavity, with the body comprised of a first end portion and a second end portion. The first end portion of the second member is configured to mate with the first end portion of the first member. The first end portion of the second member comprises at least one groove configured to engageably receive the pin of the first end portion of the first member. The seal is configured to fit between the first member and the second member. The electronics is configured to mount within the cavity of the second member. The first member and second member are rotated in opposite directions, until the pin of the first member is locked into the groove of the second member, to seal the electronics in the housing.

18 Claims, 7 Drawing Sheets

HOUSING FOR INTRINSICALLY-SAFE ELECTRONICS

RELATED APPLICATIONS

This application claims priority to and is a continuation-in-part of prior nonprovisional application 09/540,858, filed Mar. 31, 2000, which is incorporated herein by reference.

FIELD OF THE INVENTION

This invention relates to housings, and more particularly, to housings that enclose intrinsically-safe electronics.

BACKGROUND

Electronics for many applications may be required to operate in caustic or potentially explosive environments. The operation of electronics in a potentially explosive environment can result in ignition of volatile material. One solution is to enclose the electronics in an explosion-proof housing isolated from the environment. Making a housing explosion-proof includes issue of encapsulation, pressurization, and flameproof containment. An explosion-proof housing design requires a flame-path of a sufficient length to cool any material escaping from a container if combustion does occur within the housing. Flame-path length is a function of the length of a machined thread. Explosion-proof housings are generally more expensive to fabricate and require additional wall thickness and structural support.

Another solution when electronics are used in volatile environments is to design the electronics to intrinsically-safe standards. Intrinsically-safe electronics operate at a low power level below a particular energy threshold. Operating a device at a low power level ensures that heat or spark generation will not occur. The power-level requirements for intrinsically-safe electronics are established by regulatory agencies such as the Underwriters Laboratory (UL) in the United States, CENELEC in Europe, CSA in Canada and TIIS in Japan.

When intrinsically-safe electronics are operated in a caustic or volatile environment, it is necessary to protect the electronics in a housing to prevent circuit damage or failure. A problem with housings for intrinsically-safe electronics is that the housing must be sealed to prevent environmental intrusion. It is also desirable that a housing for intrinsically-safe electronics be modular and interchangeable so that housing parts can be mass-produced. A housing may be formed using one or more members that are combined to form an enclosure that contains the electronics. There is a cost advantage to using intrinsically-safe electronics instead of explosion-proof designs because of the less stringent requirements for an intrinsically-safe electronics housing. However, prior methods of assembling the members used to form a housing for intrinsically-safe electronics are virtually identical to the methods used for explosion-proof housings. Methods for assembling the members could include bolting, welding, or affixing via a threaded fitting. However, each of these methods of assembling has cost, manufacturing, or logistical limitations that render such methods undesirable, and which offset the cost savings of an intrinsically-safe design. Actual cost-benefits depend upon finding a solution for assembling and sealing parts of a housing that is as robust and reliable as prior methods, and also allows rapid precision alignment of parts, but does not require precision machining.

One application for electronics that operate in a volatile environment is a Coriolis flowmeter. A Coriolis mass flow-meter measures mass flow and other information of materials flowing through a pipeline in the manner described by U.S. Pat. No. 4,491,025 issued to J. E. Smith, et al. of Jan. 1, 1985 and Re. 31,450 to J. E. Smith of Feb. 11, 1982. A Coriolis mass flowmeter has one or more flow tubes of a curved or straight configuration. Each flow tube configuration in a Coriolis mass flowmeter has a set of natural vibration modes, which may be of a simple bending, torsional, radial, or coupled type. Each flow tube is driven to oscillate at resonance in one of these natural modes. The natural vibration modes of the vibrating, material filled systems are defined in part by the combined mass of the flow tubes and the material within the flow tubes. Material flows into the flowmeter from a connected pipeline on the inlet side of the flowmeter. The material is then directed through the flow tube or flow tubes and exits the flowmeter to a pipeline connected on the outlet side.

A driver applies a vibrational force to the flow tube. The force causes the flow tube to oscillate. When there is no material flowing through the flowmeter, all points along a flow tube oscillate with an identical phase. As a material begins to flow through the flow tube, Coriolis accelerations cause each point along the flow tube to have a different phase with respect to other points along the flow tube. The phase on the inlet side of the flow tube lags the driver, while the phase on the outlet side leads the driver. Pickoffs are placed at two different points on the flow tube to produce sinusoidal pickoff signals representative of the motion of the flow tube at the two points. A phase difference of the two signals received from the pickoffs is calculated in units of time. The phase difference between the two pickoff signals is proportional to the mass flow rate of the material flowing through the flow tube or flow tubes.

The sensors transmit the sinusoidal signals to meter electronics. The meter electronics generates parameter signals that indicate properties of the material flowing through the flowmeter. The meter electronics also generates a drive signal applied to the driver to vibrate the flow tubes. The parameter signals are then transmitted to a host system which provides the desired properties to a user.

Coriolis flowmeters have inherent power requirements necessary for ordinary operation that generally have required conformance to explosion-proof designs. In the prior art, the standard practice has been to design flowmeters to explosion-proof standards. An explosion-proof design requires that the meter electronics be contained in an explosion-proof container, which typically encompasses the entire flowmeter. Another method of the prior art removes the meter electronics from the flowmeter and into another housing that is explosion-proof, but attached to the flowmeter. This method requires that the meter electronics housing comply with all appropriate mandates for an explosion-proof design, which includes precision thread machining of fitted members of the housing for proper flame path length. Precision thread machining is expensive, and is easily damaged under normal use. Additionally, machining of parts contributes a step to the manufacturing process, adding time to fabrication and also increasing costs.

Another method is to use intrinsically-safe electronics in a separate housing for the meter electronics. This method allows the use of housings designed to the more relaxed intrinsically-safe housing requirements. The primary advantage of the intrinsically-safe design approach is the application of less stringent housing requirements. However, in the prior art the cost of attaching and sealing parts to form enclosures for this purpose has not provided a commercial benefit because of the cost of manufacture. A method for enclosing electronics meeting intrinsically-safe standards is desired that provides a rapid, effective, robust, and reliable means for sealing multiple members of a housing as well as prior methods while providing ease of manufacture and cost savings.

STATEMENT OF THE SOLUTION

The above and other problems are solved and an advance in the art is achieved through the provision of a cam-lock assembly for affixing and sealing members of a housing for containing intrinsically-safe electronics. The first distinct advantage of the present invention is the ability to cast a cam-lock feature, thereby avoiding the expense of precision machining after casting as in threaded attachment methods. A second distinct advantage of the present invention is the ease of coupling and sealing members used to form a housing for intrinsically-safe electronics. Members of a housing may be attached or detached with ease using a twisting action as in threaded assemblies. Another feature of the cam-lock is that members may have one of several predetermined orientations when coupled simply by casting multiple cam-lock features into the members.

In one example of the invention, the housing comprises a first member, a second member, a seal, and electronics. The first member has a body comprised of a first end portion and a second end portion. The first end portion of the first member comprises at least one pin protruding from the first end portion of the first member. The second member has a body and a cavity, with the body comprised of a first end portion and a second end portion. The first end portion of the second member is configured to mate with the first end portion of the first member. The first end portion of the second member comprises at least one groove configured to engageably receive the pin of the first end portion of the first member. The seal is configured to fit between the first member and the second member. The electronics is configured to mount within the cavity of the second member. Advantageously, the first member can be cast with the pin and the second member can be cast with the groove. The first and second members do not have to be machined any further, which would be the case if the first and second members were threaded. Therefore, the housing does not required as much precision machining which cuts down on time and cost.

Another example of the invention involves a method for sealing the electronics within the housing. The method begins by mounting the electronics within the cavity of the second member. The method also includes positioning the seal between the first member and the second member. The method also includes mating the first end portion of the second member with the first end portion of the first member. The method also includes rotating the first member and the second member in opposing directions relative to one another thereby sliding the pin of the first end portion of the first member into the groove of the first end portion of the second member. With the second member and first member joined and the pin slid into the groove, the housing forms an intrinsically-safe housing. The combination of the pin and the groove can be considered a cam-lock system.

In another example of the invention, the housing further includes a third member. The third member comprises a body having a first end portion and a second end portion. The first end portion of the third member comprises at least one pin protruding from the first end portion. The pin of the first end portion of the third member is configured to engage with a groove on the second end portion of the second member. The third member also includes a mount. The mount is configured to affix the third member to another surface, such as a surface on a Coriolis flowmeter.

In another example of the invention, the first member includes a cavity within the body of the first member. The first member also includes a user interface mounted in the cavity. The user interface is configured to communicate with the electronics mounted in the second member to provide an interface between an operator and the electronics. In another example of the invention, the housing further includes wiring and an opening in either the first member or the second member. The wiring connects to the electronics and extends from inside the cavity of the second member and through the opening to outside of the housing.

One aspect of the invention includes a housing, comprising:
a first member having:
a body comprised of a first end portion and a second end portion, said first end portion of said body of said first member comprising at least one pin protruding from said first end portion of said body of said first member;
said housing further comprising a second member having:
a body comprised of a first end portion and a second end portion, said first end portion of said body of said second member configured to mate with said first end portion of said body of said first member, said first end portion of said body of said second member comprising at least one groove configured to engageably receive said at least one pin of said first end portion of said body of said first member, and
a cavity within said body of said second member;
said housing further comprising a seal configured to fit between said first member and said second member; and
said housing further comprising electronics configured to mount within said cavity of said second member.

Another aspect of the invention includes a housing wherein said second end portion of said body of said first member comprises:
an end surface affixed to said body of said first member that encloses said second end portion of said body of said first member.

Another aspect of the invention includes a housing wherein said end surface comprises a gripping surface on said end surface.

Another aspect of the invention includes a housing wherein said body of said first member comprises:
a cavity within said body of said first member; and
a user interface mounted in said cavity within said body of said first member and configured to communicate with said electronics.

Another aspect of the invention includes a housing wherein:
said first end portion of said body of said first member is substantially circular; and
said first end portion of said body of said second member is substantially circular.

Another aspect of the invention includes a housing wherein:
said at least one pin protrudes from an inner surface of said first end portion of said body of said first member toward the center of said first member; and
said at least one groove extends along an outer surface of said first end portion of said body of said second member.

Another aspect of the invention includes a housing wherein:
  said at least one pin protrudes radially from an outer surface of said first end portion of said body of said first member; and
  said at least one groove extends along an inner surface of said first end portion of said body of said second member.

Another aspect of the invention includes a housing further comprising:
  a wave washer configured to fit between said first member and said second member.

Another aspect of the invention includes a housing wherein:
  said first end portion of said body of said first member comprises four pins protruding from said first end portion of said body of said first member; and
  said first end portion of said body of said second member comprises four grooves configured to engageably receive said four pins of said first end portion of said body of said first member.

Another aspect of the invention includes a housing further comprising:
  a third member having:
    a body comprised of a first end portion and a second end portion, said first end portion of said body of said third member configured to mate with said second end portion of said body of said second member, said first end portion of said body of said third member comprising at least one pin protruding from said first end portion of said body of said third member;
  said second end portion of said body of said second member comprising at least one groove configured to engageably receive said at least one pin of said first end portion of said body of said third member.

Another aspect of the invention includes a housing wherein said third member further comprises a mount configured to affix said second end portion of said body of said third member to a Coriolis flowmeter.

Another aspect of the invention includes a housing wherein said second member comprises a mount configured to affix said second end portion of said body of said second member to a Coriolis flowmeter.

Another aspect of the invention includes a housing wherein said electronics comprises meter electronics for a Coriolis flowmeter.

Another aspect of the invention includes a housing wherein said at least one groove of said first end portion of said body of said second member comprises a detent at an end of said at least one groove.

Another aspect of the invention includes a housing wherein said seal comprises an O-ring.

Another aspect of the invention includes a housing further comprising:
  wiring connected to said electronics; and
  an opening in one of said first member or said second member for said wiring to extend from inside said cavity to outside said cavity.

Another aspect of the invention includes a method for sealing said electronics in the housing, said method comprising the steps of:
  mounting said electronics within said cavity of said second member;
  positioning said seal between said first member and said second member;
  mating said first end portion of said body of said second member with said first end portion of said body of said first member; and
  rotating said first member and said second member in opposing directions relative to one another thereby sliding said at least one pin of said first end portion of said body of said first member into said at least one groove of said first end portion of said body of said second member.

Another aspect of the invention includes the step of positioning a wave washer between said first member and said second member prior to mating said first end portion of said body of said second member with said first end portion of said body of said first member.

Another aspect of the invention includes the step of mounting said second end portion of said body of said second member to a Coriolis flowmeter.

Another aspect of the invention includes the step of connecting said electronics to a Coriolis flowmeter.

BRIEF DESCRIPTION OF THE DRAWINGS

The above and other features of the invention can be understood from reading the detailed description and the following drawings.

DETAILED DESCRIPTION OF THE INVENTION

FIGS. 1–7 and the following description depict specific examples of housings to enclose electronics to teach those skilled in the art how to make and use the best mode of the invention. For the purpose of teaching inventive principles, some conventional aspects of the FIGS. 1–7 have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
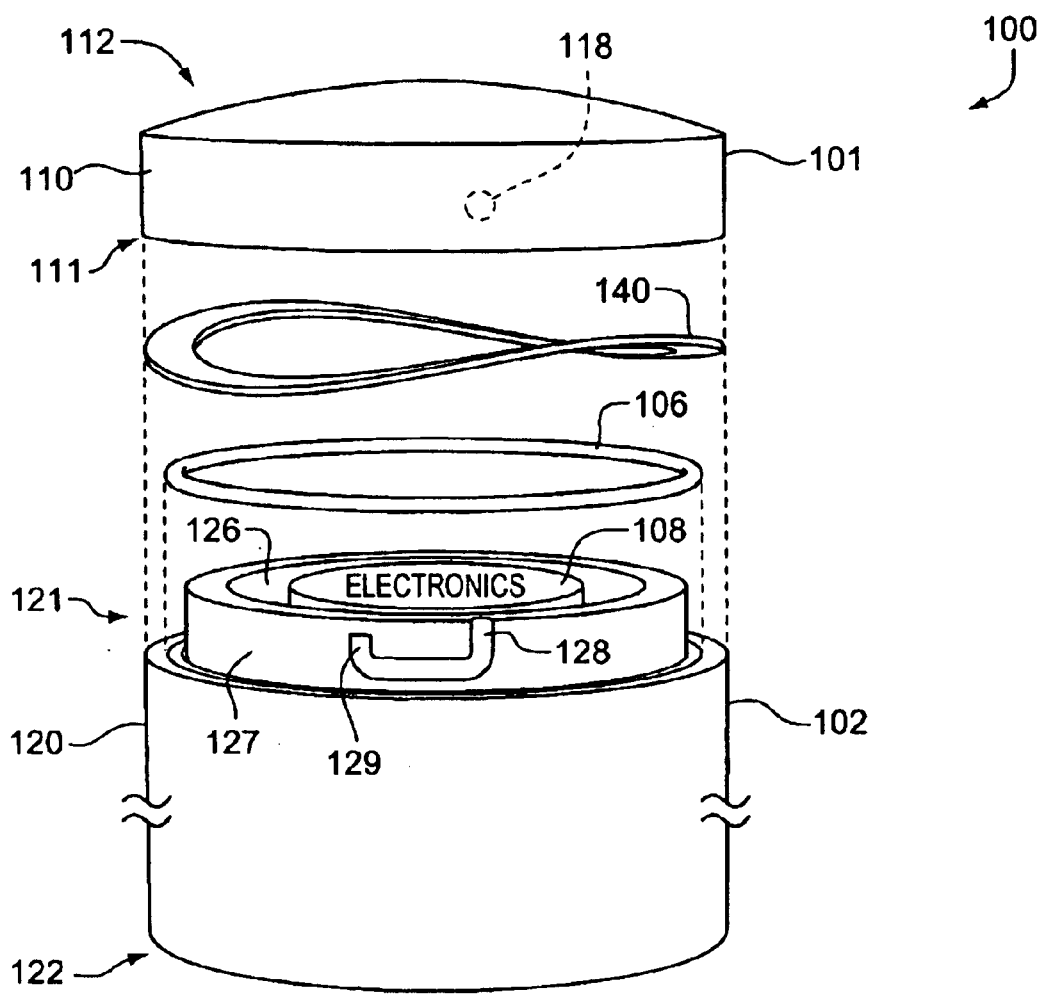
FIG. 1 illustrates a housing in an example of the invention.
Figure 2:
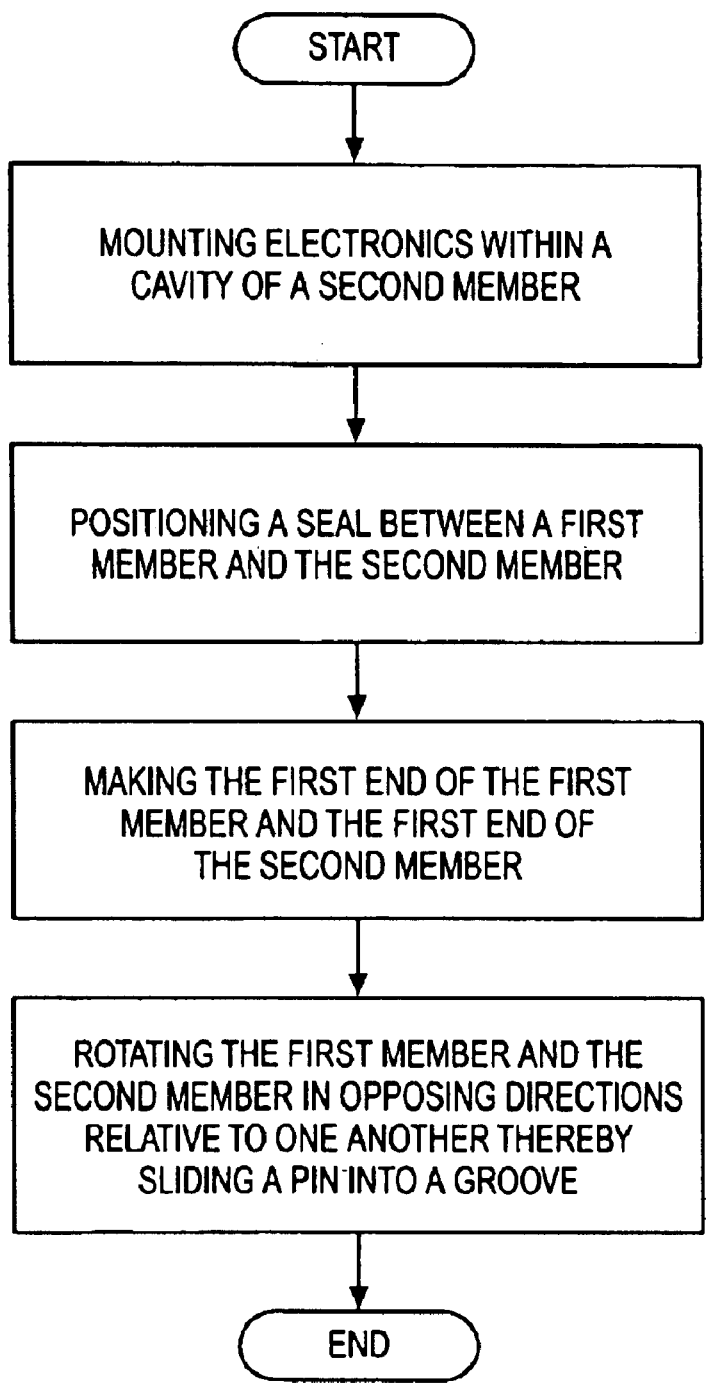
FIG. 2 illustrates a flow chart of a method for sealing electronics within a housing in an example of the invention.

Housing—FIGS. 1–2

FIG. 1 illustrates a housing 100 in an example of the invention. Housing 100 is comprised of a first member 101, a second member 102, a seal 106, and electronics 108. The first member 101 comprises a body 110 having a first end portion 111 and a second end portion 112. First end portion 111 of first member 101 comprises at least one pin 118 protruding from first end portion 111. In this example, pin 118 protrudes from an inner surface (not visible in FIG. 1) of first end portion 111 toward the center of first member 101. Pin 118 could also protrude radially from an outer surface of first end portion 111. Pin 118 could also protrude from a bottom surface of first end portion 111 perpendicular to the bottom surface.

Second member 102 comprises a body 120 having a first end portion 121 and a second end portion 122. Second member 102 has a cavity 126 within body 120. First end portion 121 of second member 102 comprises at least one groove 128. In this example, groove 128 extends along an outer surface 127 of first end portion 121 as is depicted in FIG. 1. Groove 128 could also extend along an inner surface of first end portion 121. Groove 128 could also extend along a top surface of first end portion 121.

Groove 128 of second member 102 is configured to engageably receive pin 118 of first member 101. First end portion 121 of second member 102 is configured to mate with first end portion 111 of first member 101. Seal 106 is configured to fit between first member 101 and second member 102. In one example, seal 106 is configured to fit between first end portion 111 of first member 101 and first end portion 121 of second member 102. One example of seal 106 is an O-ring. Electronics 108 is configured to mount within cavity 126 of second member 102.

FIG. 2 illustrates a flow chart of a method for sealing electronics 108 within housing 100. Method begins in step 202 by mounting electronics 108 within cavity 126 of second member 102. Step 204 includes positioning seal 106 between first member 101 and second member 102. Step 206 includes mating first end portion 121 of second member 102 with first end portion 111 of first member 101. Step 208 includes rotating first member 101 and second member 102 in opposing directions relative to one another thereby sliding pin 118 of first end portion 111 of first member 101 into groove 128 of first end portion 121 of second member 102. With second member 102 and first member 101 joined and pin 118 slid into groove 128, housing 100 forms an intrinsically-safe housing. The combination of pin 118 and groove 128 can be considered a cam-lock system.

In some examples, housing 100 also includes a wave washer 140. Wave washer 140 is configured to fit between first end portion 111 of first member 101 and first end portion 121 of second member 102. In some examples, groove 128 of first end portion 121 of second member 102 comprises a detent 129 at an end of groove 128. The detent 129 is configured to be a stop position for pin 118 when pin 118 is slid into groove 128.

Figure 3:
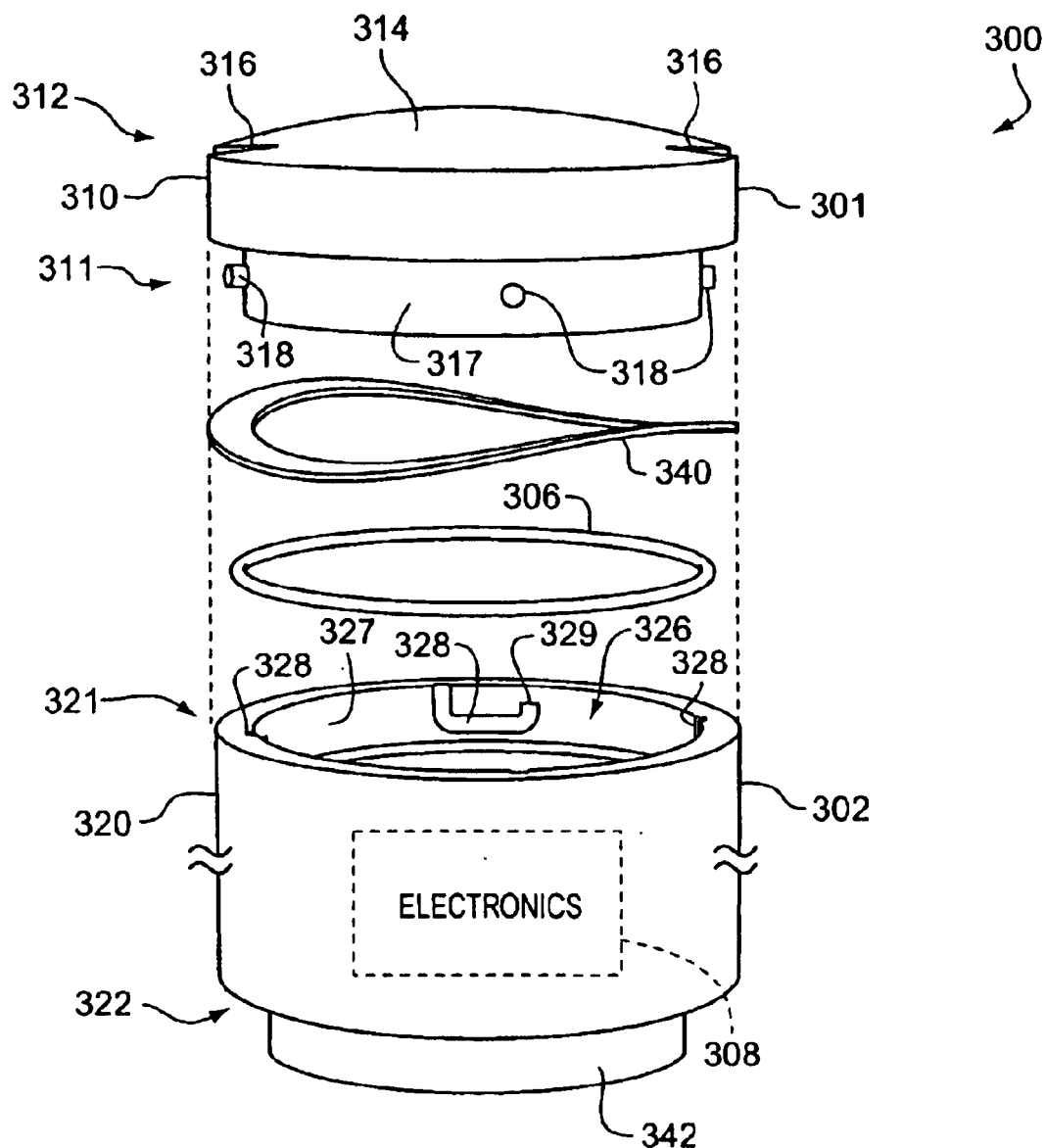
FIG. 3 illustrates a housing with multiple orientations in an example of the invention.

Housing with Multiple Orientations—FIG. 3

FIG. 3 illustrates a housing 300 with multiple orientations in an example of the invention. Housing 300 is comprised of a first member 301, a second member 302, a seal 306, a wave washer 340, and electronics 308. First member 301 comprises a body 310 having a first end portion 311 and a second end portion 312. First end portion 311 is substantially circular. First end portion 311 of first member 301 comprises four pins 318 protruding from first end portion 311. Pins 318 protrude radially from an outer surface 317 of first end portion 311. Second end portion 312 of first member 301 comprises an end surface 314 enclosing second end portion 312 of first member 301. End surface 314 comprises a gripping surface 316. Gripping surface 316 comprises at least one indentation in end surface 314.

Second member 302 comprises a body 320 having a first end portion 321 and a second end portion 322. First end portion 321 is substantially circular. Second member 302 has a cavity 326 within body 320 that extends from first end portion 321 to second end portion 322. First end portion 321 of second member 302 comprises four grooves 328. Grooves 328 extend along an inner surface 327 of first end portion 321. Grooves 328 of second member 302 each comprise a detent 329 at an end of grooves 328. The detent 329 is configured to be a stop position for pins 318 of first member 301 when pins 318 are slid into grooves 328.

First end portion 321 of second member 302 is configured to mate with first end portion 311 of first member 301. Grooves 328 of second member 302 are configured to engageably receive pins 318 of first member 301. Grooves 328 and pins 318 connected together to form a cam-lock system. Seal 306 is configured to fit between first member 301 and second member 302. Wave washer 340 is configured to fit between first member 301 and second member 302. Electronics 308 is configured to mount within cavity 326 of second member 302. Electronics 308 are intrinsically-safe electronics. Electronics 308 is shown in FIG. 3 as being mounted with cavity 326 of second member 302.

In some examples, second member 302 includes a mount 342. Mount 342 is configured to affix second member 302 to another surface, such as a surface on a Coriolis flowmeter.

By having four pins 318 of first member 301 and four grooves 328 of second member 302, first member 301 can be orientated in multiple positions in relation to second member 302. First member 301 and second member 302 can be rotated in opposite directions relative to each other to form a sealed connection. Gripping surface 316 allows an operator to more easily grip and rotate first member 301 to enclose electronics 308 in housing 300. With first member 301 and second member 302 joined and sealed, housing 300 forms an intrinsically-safe housing for electronics 308.

Figure 4:
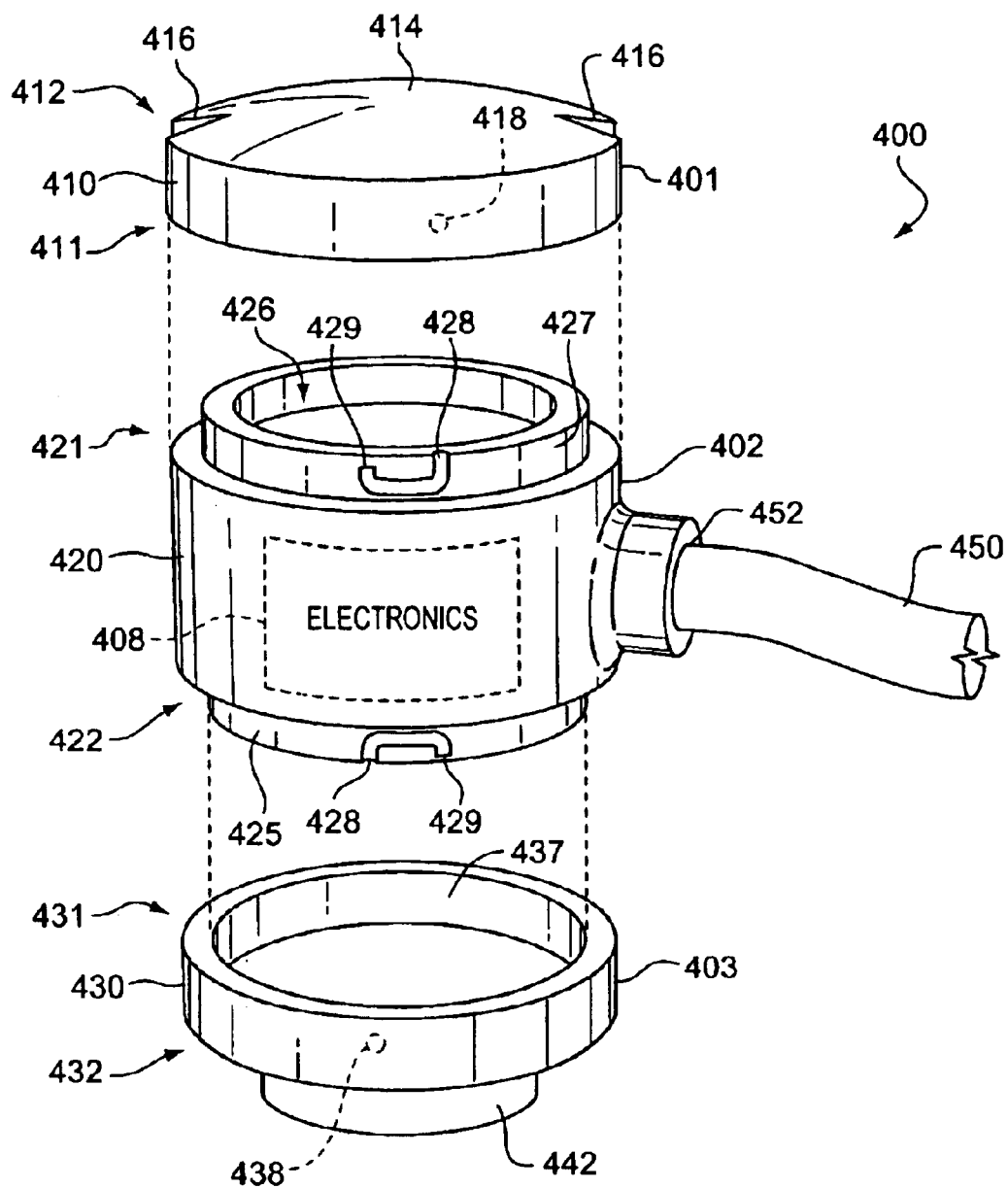
FIG. 4 illustrates a housing with multiple members in an example of the invention.

Housing with Multiple Members—FIG. 4

FIG. 4 illustrates a housing 400 with multiple members in an example of the invention. Housing 400 is comprised of a first member 401, a second member 402, a third member 403, seals 406, wave washers 440, electronics 408, and wiring 450. The first member 401 comprises a body 410 having a first end portion 411 and a second end portion 412. First end portion 411 is substantially circular. First end portion 411 of first member 401 comprises at least one pin 418 protruding from first end portion 411. Pin 418 protrudes from an inner surface (not shown) of first end portion 411 toward the center of first member 401. Second end portion 412 of first member 401 comprises an end surface 414 enclosing second end portion 412 of first member 401. End surface 414 comprises a gripping surface 416. Gripping surface 416 comprises at least one indentation in the end surface.

Second member 402 comprises a body 420 having a first end portion 421 and a second end portion 422. First end portion 421 and second end portion 422 are substantially circular. Second member 402 has a cavity 426 within body 420 that extends from first end portion 421 to second end portion 422. First end portion 421 of second member 402 comprises at least one groove 428. Groove 428 of first end portion 421 extends along an outer surface 427 of first end portion 421. Second end portion 422 of second member 402 comprises at least one groove 428. Groove 428 of second end portion 422 extends along an outer surface 425 of second end portion 422. Grooves 428 of second member 402 each comprise a detent 429 at an end of grooves 428. The detent 429 is configured to be a stop position for pins when pins are into slid into grooves 428. Second member 402 also comprises an opening 452 in body 420. Third member 403 comprises a body 430 having a first end portion 431 and a second end portion 432. First end portion 431 is substantially circular. First end portion 431 of third member 403 comprises at least one pin 438 protruding from first end portion 431. Pin 438 protrudes from an inner surface 437 of first end portion 431 toward the center of third member 403. Third member 403 also includes a mount 442. Mount 442 is configured to affix third member 403 to another surface. In some examples, mount 442 is configured to affix third member 403 to a surface on a Coriolis flowmeter.

First end portion 421 of second member 402 is configured to mate with first end portion 411 of first member 401. Second end portion 421 of second member 402 is configured to mate with first end portion 431 of third member 403. Grooves 428 of second member 402 are configured to receive pin 418 of first member 401 and pin 438 of third member 403. Seals 406 are configured to fit between first member 401 and second member 402, and between third member 403 and second member 402. Wave washers 440 are configured to fit between first member 401 and second member 402, and between third member 403 and second member 402. Electronics 408 is configured to mount within cavity 426 of second member 402. Electronics 408 are intrinsically-safe electronics. Wiring 450 connects to electronics 408 inside cavity 426 of second member 402. Wiring 450 extends from inside cavity 426 and through opening 452 to the outside of cavity 426. Wiring 450 can then be connected to auxiliary electronics external to housing 400.

First member 401 and second member 402 can be rotated in opposite directions relative to each other to form a sealed connection. Second member 402 and third member 403 can also be rotated in opposite directions relative to each other to form a seal connection. Gripping surface 416 allows an operator to more easily grip and rotate first member 401 to enclose electronics 408 in housing 400. With first member 401, second member 402, and third member 403 joined and sealed, housing 400 forms an intrinsically-safe housing for electronics 408. Housing 400 is illustrated in this example as having three members. However, housing 400 could include more than three members sealed in the manner described above.

Figure 5:
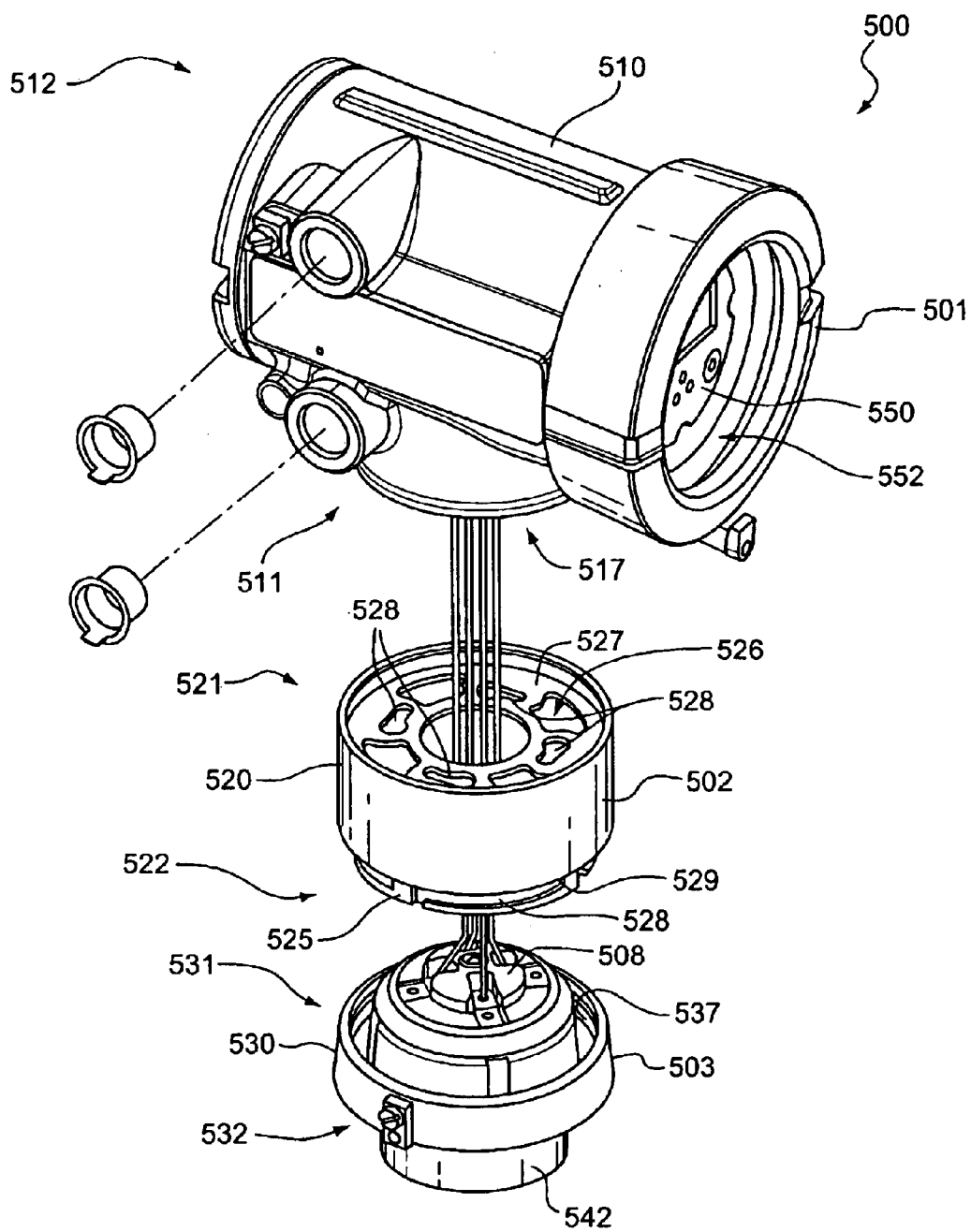
FIG. 5 illustrates a housing with a user interface in an example of the invention.

Housing with User Interface—FIG. 5

FIG. 5 illustrates a housing 500 with a user interface in an example of the invention. Housing 500 is comprised of a first member 501, a second member 502, a third member 503, electronics 508, and a user interface 550. First member 501 comprises a body 510 having a first end portion 511 and a second end portion 512. First end portion 511 is substantially circular. First member 501 includes a cavity 552 within body 510 of first member 501. First member 501 also includes user interface 550 mounted in cavity 552. First end portion 511 of first member 501 comprises four pins (not shown) protruding from first end portion 511. The pins of first end portion protrude perpendicularly from a bottom surface 517 of first end portion 511.

Second member 502 comprises a body 520 having a first end portion 521 and a second end portion 522. First end portion 521 and second end portion 522 are substantially circular. Second member 502 has a cavity 526 within body 520 that extends from first end portion 521 to second end portion 522. First end portion 521 of second member 502 comprises four grooves 528. Grooves 528 of first end portion 521 extend along a top surface 527 of first end portion 521. Second end portion 522 of second member 502 also comprises four grooves 528. Grooves 528 of second end portion 522 extend along an outer surface 525 of second end portion 522. Grooves 528 of second member 502 each comprise a detent 529 at an end of grooves 528. The detent 529 is configured to be a stop position for pins when the pins are slid into grooves 528.

Third member 503 comprises a body 530 having a first end portion 531 and a second end portion 532. First end portion 531 is substantially circular. First end portion 531 of third member 503 comprises four pins (not shown) protruding from first end portion 531. The pins of the first end portion 531 protrude from an inner surface 537 of first end portion 531 toward the center of third member 503. Third member 503 also includes a mount 542. Mount 542 is configured to affix third member 503 to another surface. In some examples, mount 542 is configured to affix third member 503 to a surface on a Coriolis flowmeter.

First end portion 521 of second member 502 is configured to mate with first end portion 511 of first member 501. Second end portion 522 of second member 502 is configured to mate with first end portion 531 of third member 503. Grooves 528 of second member 502 are configured to receive the pins of first member 501 and the pins of third member 503. Electronics 508 is configured to mount within cavity 526 of second member 502. Housing 500 could also include a seal and a wave washer (not shown) between first member 501 and second member 502, and between second member 502 and third member 503.

First member 501 and second member 502 can be rotated in opposite directions relative to each other to form a sealed connection. Second member 502 and third member 503 can also be rotated in opposite directions relative to each other to form a sealed connection. With first member 501, second member 502, and third member 503 joined and sealed, housing 500 forms an intrinsically-safe housing for electronics 508 and user interface 550.

User interface 550 in first member 501 connects to electronics 508 in second member 502. User interface 550 allows an operator to receive output information from electronics 508. User interface 550 also allows the operator to send input information to electronics 508. By having four pins in first member 501 and four grooves in second member 502, first member 501 can be orientated in multiple positions in relation to second member 502. For instance, if user interface 550 includes a display, an operator can orientate the first member 501 in four different directions to better view the display.

Figure 6:
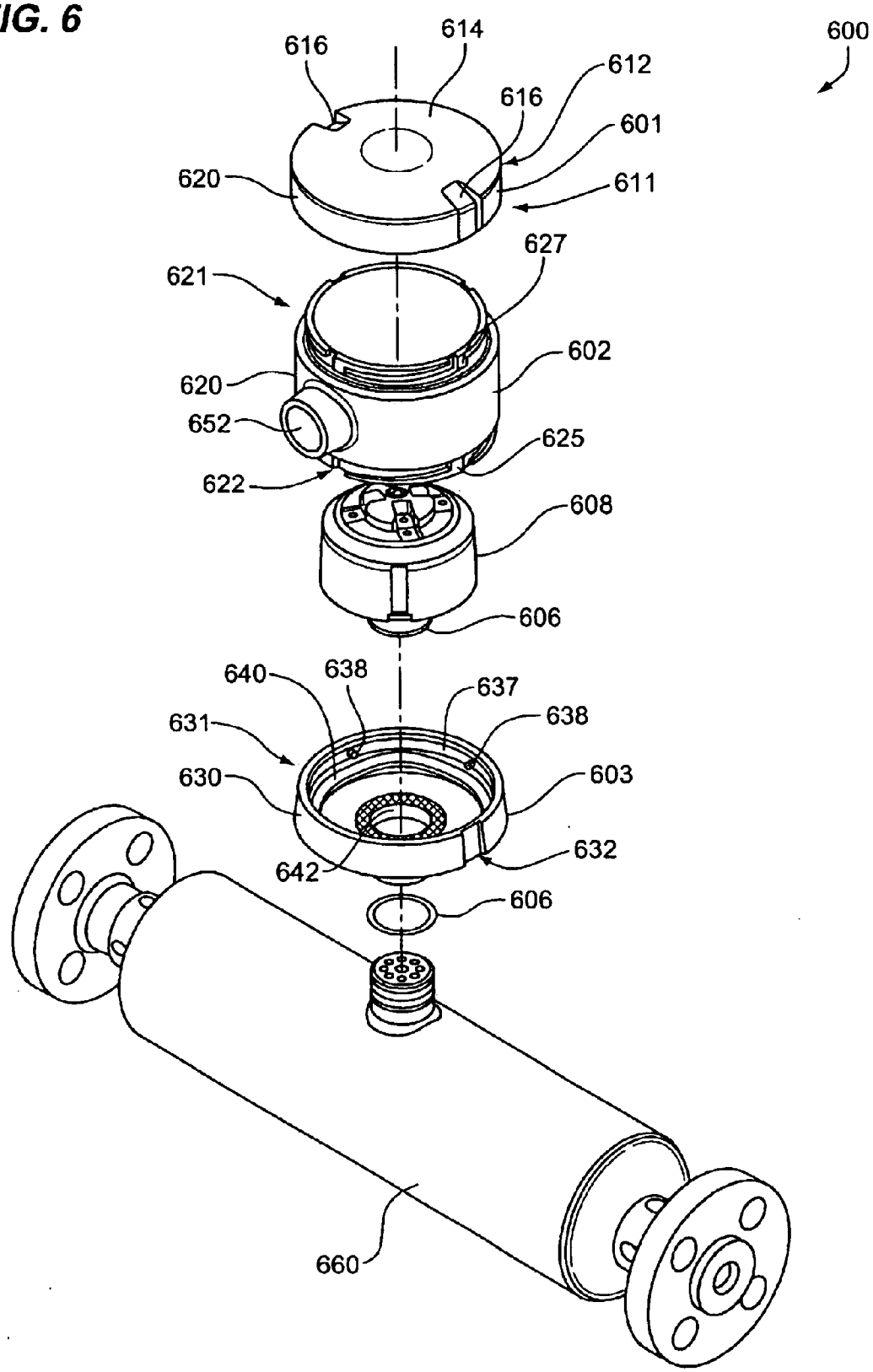
FIG. 6 illustrates a housing connected to a Coriolis flowmeter in an example of the invention.
Figure 7:
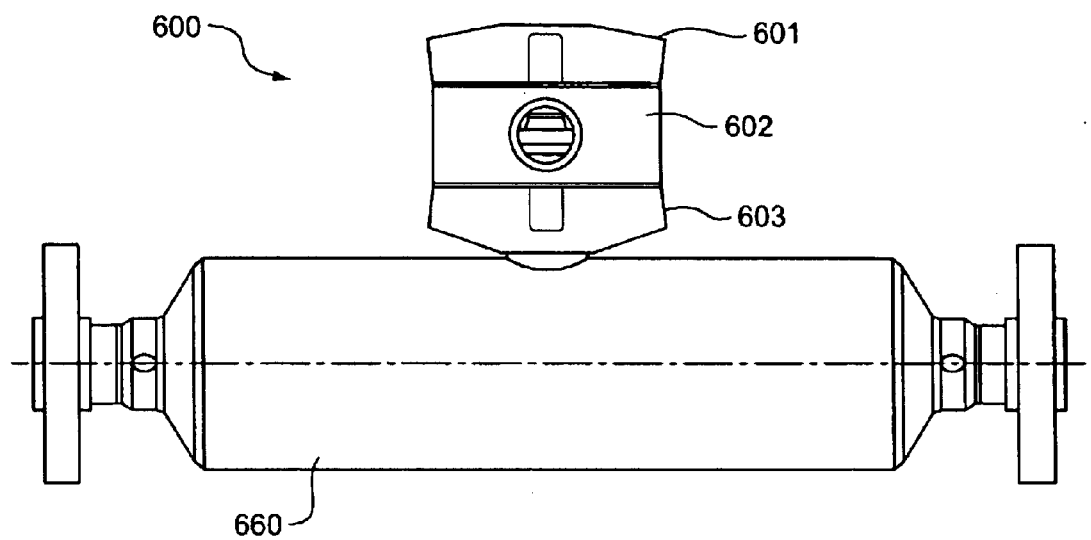
FIG. 7 illustrates a sealed housing connected to a Coriolis flowmeter in an example of the invention.

Housing Connected to a Coriolis Flowmeter—FIGS. 6–7

FIG. 6 illustrates a housing 600 connected to a Coriolis flowmeter in an example of the invention. Housing 600 is comprised of a first member 601, a second member 602, a third member 603, electronics 608, O-rings 606, a wave washer 640, and a Coriolis flowmeter 660. Coriolis flowmeter 660 is shown as a single tube flowmeter. However, housing 600 could be used with any type of flowmeter, including curved tube flowmeters and straight tube flowmeters.

First member 601 comprises a body 610 having a first end portion 611 and a second end portion 612. First end portion 611 is substantially circular. First end portion 611 of first member 601 comprises at least one pin (not shown) protruding from first end portion 611. The pin is not visible in FIG. 6. The pin protrudes from an inner surface (not shown) of first end portion 611 toward the center of first member 601. Second end portion 612 of first member 601 comprises an end surface 614 enclosing second end portion 612 of first member 601. End surface 614 comprises a gripping surface 616. Gripping surface 616 comprises at least one indentation in said end surface 614.

Second member 602 comprises a body 620 having a first end portion 621 and a second end portion 622. First end portion 621 and second end portion 622 are substantially circular. Second member 602 has a cavity 626 within body 620 that extends from first end portion 621 to second end portion 622. First end portion 621 of second member 602 comprises at least one groove 628. Groove 628 of first end portion 621 extends along an outer surface 627 of first end portion 621. Second end portion 622 of second member 602 comprises at least one groove 628. Groove 628 of first end portion 621 extends along an outer surface 625 of second end portion 622. Grooves 628 of second member 602 each comprise a detent 629 at an end of grooves 629. The detent 629 is configured to be a stop position for a pin when the pin is slid into groove 628. Second member 602 also comprises an opening 652 in body 620.

Third member 603 comprises a body 630 having a first end portion 631 and a second end portion 632. First end portion 631 is substantially circular. First end portion 631 of third member 603 comprises at least one pin 638 protruding from first end portion 631. Pin 638 protrudes from an inner surface 637 of first end portion 631 toward the center of third member 603. Third member 603 also includes a mount 642. Mount 642 is configured to affix third member 603 to Coriolis flowmeter 660.

First end portion 621 of second member 602 is configured to mate with first end portion 611 of first member 601. Second end portion 622 of second member 602 is configured to mate with first end portion 631 of third member 603. Grooves 628 of second member 602 are configured to receive the pins of first member 601 and pins 638 of third member 603. Seal 606 is configured to fit between third member 603 and second member 602. Wave washer 640 is configured to fit between third member 603 and second member 602. A comparable seal and wave washer are used between first member 601 and second member 602, but are not shown to avoid FIG. 6 from being cumbersome. Electronics 608 is configured to mount within cavity 626 of second member 602. Electronics 608 is meter electronics configured to communicate with sensors in Coriolis flowmeter 660.

First member 601 and second member 602 are rotated in opposite directions relative to each other to form a sealed connection. Second member 602 and third member 603 are also rotated in opposite directions relative to each other to form a sealed connection. With first member 601, second member 602, and third member 603 joined and sealed, housing 600 forms an intrinsically-safe housing for electronics 608. Third member 603 is then affixed to Coriolis flowmeter 660 through mount 642. Housing 600 thus forms an intrinsically-safe housing that is connected to Coriolis flowmeter 660. FIG. 7 illustrates a sealed housing 600 connected to Coriolis flowmeter 660 in an example of the invention.

Referring again to FIG. 6, when Coriolis flowmeter 660 is operating, Coriolis flowmeter 660 generates signals that indicate the motion of flow tubes within Coriolis flowmeter 660. Coriolis flowmeter 660 transmits the signals to electronics 608 within housing 600. Electronics 608 can be connected to auxiliary electronics outside of housing 600 by wiring. The wiring from extends from inside housing 600 and through opening 652 to the outside of housing 600. Electronics 608 could also be connected to a user interface as described in FIG. 5.

What is claimed is:

1. A measuring device comprising:
    a housing body comprising:
        a cavity formed in said body;
        at least one aperture formed in an exterior of said housing body; and
        at least one groove formed in said housing body;
        at least one cap corresponding to said at least one aperture, with said at least one cap comprising:
            one or more sidewalls;
            an endwall; and
            at least one pin protruding from said cap and corresponding to said at least one groove formed in said housing body;
            wherein said at least one cap substantially seals said cavity of said housing body when said at least one cap is assembled to said housing body;
        at least one seal configured to fit between said housing body and said at least one cap, with said at least one seal substantially, sealing said at least one cap to said housing body when said measuring device is assembled; and flowmeter electronics configured to mount within said cavity of said housing body, wherein said electronics are substantially sealed within said cavity when said at least one cap is assembled to said housing body and when said at least one pin of said at least one cap engages said at least one groove of said housing body.

2. The measuring device of claim 1, said electronics comprise Coriolis flowmeter electronics.

3. The measuring device of claim 1, wherein said at least one cap further comprises a gripping surface.

4. The measuring device of claim 1, with the at least one groove further comprising at least one corresponding detent formed in said at least one groove.

5. The measuring device of claim 1, wherein said at least one groove comprises four grooves and wherein said at least one pin comprises four pins.

6. The measuring device of claim 1, wherein said at least one pin extends inwardly from said one or more sidewalls of said at least one cap and wherein said at least one groove extends along an outer surface of said housing body adjacent to said at least one aperture.

7. The measuring device of claim 1, wherein said at least one pin extends outwardly from said one or more sidewalls of said at least one cap and wherein said at least one groove extends along an inner surface of said housing body adjacent to said at least one aperture.

8. The measuring device of claim 1, further comprising a mount formed on one of said housing body or said at least one cap and wherein said mount is adapted to affix said measuring device to an underlying device.

9. The measuring device of claim 1, further comprising a mount formed on one of said housing body or said at least one cap and wherein said mount is adapted to affix said measuring device to a flowmeter.

10. The measuring device of claim 1, with one of said housing body or said at least one cap further comprising an externally accessible user interface that is configured to communicate with said electronics.

11. The measuring device of claim 1, further comprising a wave washer configured to fit between said housing body and said at least one cap.

12. The measuring device of claim 1, further comprising:
    wiring connected to said electronics; and
    an opening in one of said housing body or said at least one cap for said wiring to extend from inside said cavity to outside said cavity.

13. The measuring device 1, wherein said at least one aperture in said housing body comprises two apertures, wherein said at least one cap comprises two caps, and wherein at least one seal comprises two seals.

14. The measuring device of claim 1, wherein said at least one aperture in said housing body comprises two apertures, wherein said at least one cap comprises first and second caps, wherein at least one seal comprises two seals, and wherein said second cap includes a mount adapted to affix said measuring device to an underlying surface.

15. A measuring device, comprising
a housing body comprising:
   a cavity formed in said body;
   first and second apertures formed in an exterior of said housing body; and
   at least first and second grooves formed in said housing body adjacent to said first and second apertures;
first and second caps corresponding to said first and second apertures, with said first and second caps comprising:
   one or more sidewalls;
   an endwall; and
   at least first and second pins protruding from said first and second caps and corresponding to said at least first and second grooves formed in said housing body;
   wherein said first and second caps substantially seal said cavity of said housing body when said first and second caps are assembled to said housing body;
first and second seals configured to fit between said housing body and said first and second caps, with said first and second seals substantially sealing said first and second caps to said measuring device body when said housing is assembled;
flowmeter electronics configure to mount within said cavity of said housing body and wherein said flowmeter substantially sealed within said cavity when said first and second caps are assembled to said housing body and when said at least first and second pins of said first and second caps engage said at least first and second grooves of said housing body.

16. The measuring device of claim 15, further comprising a mount formed on one of said housing body, said first cap, or said second cap and wherein said mount is adapted to affix said measuring device to an underlying device.

17. The measuring device of claim 15, with one of said housing body, said first cap, or said second cap further comprising an externally accessible user interface that is configured to communicate with said electronics.

18. The measuring device of claim 15, further comprising:
   wiring connected to said electronics; and
   an opening in one of said housing body, said first cap, or said second cap for said wiring to extend from inside said cavity to outside said cavity.

* * * * *

UNITED STATES PATENT AND TRADEMARK OFFICE
CERTIFICATE OF CORRECTION

PATENT NO. : 6,708,834 B2
DATED : March 23, 2004
INVENTOR(S) : Edwin Arthur Hagerman, III It is certified that error appears in the above-identified patent and that said Letters Patent is hereby corrected as shown below:

Column 12,
Lines 11-15, replace "seal substantially, sealing said at least one cap to said housing body when said measuring device is assembled; and flowmeter electronics configured to mount within said cavity of said housing body, wherein said electronics are substantially sealed" with
-- seal substantially sealing said at least one cap to said housing body when said measuring device is assembled; and flowmeter electronics configured to mount within said cavity of said housing body, wherein said flowmeter electronics are substantially sealed --
Line 20, replace "2. The measuring device of claim 1, said electronics" with -- 2. The measuring device of claim 1, wherein said electronics --
Line 60, replace "13. The measuring device 1, wherein said at least one" with -- 13. The measuring device of claim 1, wherein said at least one --.

Column 14,
Lines 1-5, replace "second caps to said measuring device body when said housing is assembled; flowmeter electronics configure to mount within said cavity of said housing body and wherein said flowmeter substantially sealed within said cavity when said first" with -- second caps to said housing body when said measuring device is assembled; flowmeter electronics configured to mount within said housing body and wherein said flowmeter electronics configured to mount within said cavity of said housing body and wherein said flowmeter electronics are substantially sealed within said cavity when said first --

Signed and Sealed this

Twenty-fourth Day of August, 2004

JON W. DUDAS
*Director of the United States Patent and Trademark Office*

UNITED STATES PATENT AND TRADEMARK OFFICE
CERTIFICATE OF CORRECTION

PATENT NO. : 6,708,834 B2
DATED : March 23, 2004
INVENTOR(S) : Edwin Arthur Hagerman, III It is certified that error appears in the above-identified patent and that said Letters Patent is hereby corrected as shown below:

Column 12,
Lines 11-15, replace "seal substantially, sealing said at least one cap to said housing body when said measuring device is assembled; and flowmeter electronics configured to mount within said cavity of said housing body, wherein said electronics are substantially sealed" with
-- seal substantially sealing said at least one cap to said housing body when said measuring device is assembled; and flowmeter electronics configured to mount within said cavity of said housing body, wherein said flowmeter electronics are substantially sealed --
Line 20, replace "2. The measuring device of claim 1, said electronics" with -- 2. The measuring device of claim 1, wherein said electronics --
Line 60, replace "13. The measuring device 1, wherein said at least one" with -- 13. The measuring device of claim 1, wherein said at least one --.

Column 14,
Lines 1-5, replace "second caps to said measuring device body when said housing is assembled; flowmeter electronics configure to mount within said cavity of said housing body and wherein said flowmeter substantially sealed within said cavity when said first" with -- second caps to said housing body when said measuring device is assembled; flowmeter electronics configured to mount within said cavity of said housing body and wherein said flowmeter electronics are substantially sealed within said cavity when said first --

This certificate supersedes Certificate of Correction issued August 24, 2004.

Signed and Sealed this

Twenty-sixth Day of October, 2004

JON W. DUDAS
*Director of the United States Patent and Trademark Office*